United States Patent [19]
Janke

[11] Patent Number: 5,831,427
[45] Date of Patent: Nov. 3, 1998

[54] VOLTAGE MEASURING DEVICE FOR A SOURCE WITH UNKNOWN RESISTANCE

[75] Inventor: Donald R. Janke, Milwlaukee, Wis.

[73] Assignee: Elsyn, Inc., Grafton, Wis.

[21] Appl. No.: 763,778

[22] Filed: Dec. 11, 1996

[51] Int. Cl.$^6$ .................................................. G01R 7/00
[52] U.S. Cl. ....................... 324/140 R; 324/115; 324/430
[58] Field of Search ................. 324/140 R, 713, 324/119, 98, 142, 115, 430, 636

[56] References Cited

U.S. PATENT DOCUMENTS

| | | | |
|---|---|---|---|
| 3,786,350 | 1/1974 | Munt | 324/62 R |
| 4,213,088 | 7/1980 | Nossen | 324/98 |
| 4,864,224 | 9/1989 | Roppelt et al. | 324/119 |
| 5,256,979 | 10/1993 | Moorman | 324/713 |
| 5,469,071 | 11/1995 | Obata | 324/713 |

OTHER PUBLICATIONS

*Circuits, Devices, and Systems, A First Course in Electrical Engineering*, Second Edition, pp. 656–657, Ralph J. Smith (1971; month unavailable).

*Low Level Measurements*, 4th Edition, Section 1, pp. 1–3 & 1–4; Section 3, pp. 3–6 & 3–7. (Date unavailable).

*Primary Examiner*—Josie Ballato
*Assistant Examiner*—Russell M. Kobert
*Attorney, Agent, or Firm*—Quarles & Brady

[57] ABSTRACT

A volt meter changes the dividing resistance across the terminals of a voltage source between first and second different resistances and measures voltage across the dividing resistor at the different resistances to determine an accurate voltage source magnitude from the measured voltages and the ratio of second to first resistances despite an unknown source resistance.

12 Claims, 3 Drawing Sheets

VOLTAGE MEASURING DEVICE FOR A SOURCE WITH UNKNOWN RESISTANCE

FIELD OF THE INVENTION

This invention relates to voltage measurement and more particularly to a method and apparatus for automatically and accurately measuring the voltage of a source having an unknown source impedance.

BACKGROUND OF THE INVENTION

All voltage sources have a characteristic source impedance. Where the source impedance is known, the voltage provided by the source can readily be determined by providing a dividing resistor of known value between voltage source terminals, measuring the voltage drop across the dividing resistor, and multiplying the measured voltage by the ratio of the dividing resistor plus the source impedance to the dividing resistor.

However, where the source impedance is unknown, it is more difficult to make accurate source voltage measurements. One way to estimate the magnitude of a voltage source where source impedance is unknown is to provide a relatively large (e.g. 1MΩ) dividing resistor between the source terminals, measure the voltage drop across the dividing resistor, and assume that the measured voltage is approximately equal to the source voltage. In reality, however, because some voltage drops across the source impedance, the measured voltage is inaccurate.

The logical way to increase accuracy would be to increase the size of the dividing resistor until the source impedance is negligible in comparison. In this way, virtually all the source voltage would appear across the dividing resistor and the measured voltage would therefore accurately represent the source voltage. Unfortunately, dividing resistor size is limited by voltage measurement applications and common mode problems associated with other apparatus components (e.g. differential amplifiers). In addition, increasing the size of the dividing resistor results in a voltage drop thereacross which tends to fluctuate in electrically and magnetically noisy environments. The fluctuating voltage in turn further degrades the value of the measured voltage.

Because of these limitations, the size of the dividing resistor may be limited to a value no greater than 1MΩ. With a dividing resistor of 1MΩ, in many applications, the margin of error in a measured voltage source value can exceed 0.05% of the actual source voltage. While this measurement method and associated margin of error may be satisfactory for some applications, 0.05% error is unacceptable where extremely accurate voltage measurements are required.

Another way to minimize the margin of error in the measured voltage source value is to follow the method above while assuming a source impedance value within a likely range. Many common transducer source impedance's are between 100 Ω and 500 Ω and therefore, by picking an arbitrary impedance value between 100 and 500 Ω (e.g. 250 Ω), and using the assumed source impedance in conjunction with a dividing resistor and a measured voltage across the dividing resistor, accuracy can be improved. Nevertheless, this solution, like the solution discussed above, also provides a source voltage value which is insufficiently accurate for some applications.

Other measurement solutions exist which require manual steps to determine the actual source impedance which can then be used to find the magnitude of a voltage source. Unfortunately, these manual solutions are labor intensive.

Therefore, it would be advantageous to have a volt meter that can automatically compensate a measured voltage for an unknown source resistance and provide an extremely accurate source voltage value.

SUMMARY OF THE INVENTION

The present invention provides an extremely accurate voltage meter which automatically compensates for a source resistance even where the source resistance is unknown. The present meter determines input voltage by first providing a first resistance of known value between the source terminals. The meter samples a first voltage across the first resistance. Then, the meter automatically changes the resistance between the terminals to a second known resistance and samples a second voltage across the second resistance. Depending upon the circumstances, the meter may sample other voltages at the first and second resistances. After at least two voltages are sampled across different known resistances, the meter uses the sample voltages and the ratio of the second to the first known resistances to accurately determine the input voltage.

After voltage across the controllable dividing resistance is sampled at source terminals, a single equation can be written including the sample voltage, an unknown source voltage value and an unknown source resistance. Because there are two unknowns and only a single equation, the single equation cannot be solved. However, by changing the dividing resistance to a different known value and sampling a second sample voltage across the second known resistance, two equations having only two unknowns (i.e. the source voltage and source resistance) can be provided. One of the two equations is solved for source resistance and the source resistance value is substituted into the other equation which is then solved for input voltage. In this manner, the source resistance term and error associated therewith cancel and the resulting calculated input voltage equation is extremely accurate.

Where the input voltage is not time varying (i.e. is DC), only two sample voltages must be sampled to provide an accurate calculated input voltage. However, where the input voltage is time varying, at least three sample voltages have to be sampled to provide an accurate calculated input voltage. This is because, as samples are taken, the input voltage changes so that the voltage equations corresponding to each sample have different source voltage variables (i.e. there are more than two variables). In fact, with a time varying input voltage, the number of variables will always be one greater than the number of equations. Nevertheless, as the number of samples and corresponding equations increase, the error in calculated input voltage decreases until the error is negligible.

The inventive apparatus comprises a resistive element positionable between the source and a ground, the resistive element alterable between first and second resistances. A lead is linked to the resistive element so that a sample voltage across the resistive element is provided on the lead. A controller is linked to the lead and the resistive element. The controller samples a first sample voltage at the first resistance, changes the resistive element resistance to the second resistance, samples a second sample voltage across the second resistance and uses the first and second sample voltages to determine the input voltage.

Where the input voltage is time varying, after the controller samples the second sample voltage at the second resistance, the controller alters the resistance back to the first resistance and samples a third voltage at the first resistance, and the controller determines the input voltage by mathematically combining the first, second and third sample voltages and the ratio of second to first resistances. To increase calculated input voltage accuracy where the input voltage is time varying, the controller samples first, second and third sample voltages many times and uses all of the sampled voltages to determine the input voltage.

One object of the present invention is to provide a volt meter that automatically generates voltage readings that have been compensated for unknown source impedance. By measuring the voltage across a first known resistance, changing the resistance to a second known resistance and taking a second measurement voltage across the second known resistance, the two voltage readings and known resistance values can be mathematically combined to eliminate the effect of the voltage drop across the source impedance and provide accurate compensated voltage measurement.

Another object of the invention is to provide a voltage meter that can be used to accurately identify the instantaneous voltage of an AC voltage source and provide a voltage reading that is compensated for source impedance. Where a voltage is time varying, more than two samples of the voltage are taken and all of the sample voltages and the known resistance values are mathematically combined to automatically provide an accurate voltage reading.

Yet another object is to accomplish the two objects referred to above in a simple and cost effective manner. The hardware required to provide the inventive volt meter includes only a simple microprocessor, one or more switches, several resistors, and a memory which may often be provided on the microprocessor.

Other and further objects and advantages of the present invention will become apparent through reference to the figures and detailed description that follow.

DETAILED DESCRIPTION OF THE PREFERRED EMBODIMENT

Analytical Development

Figure 1:
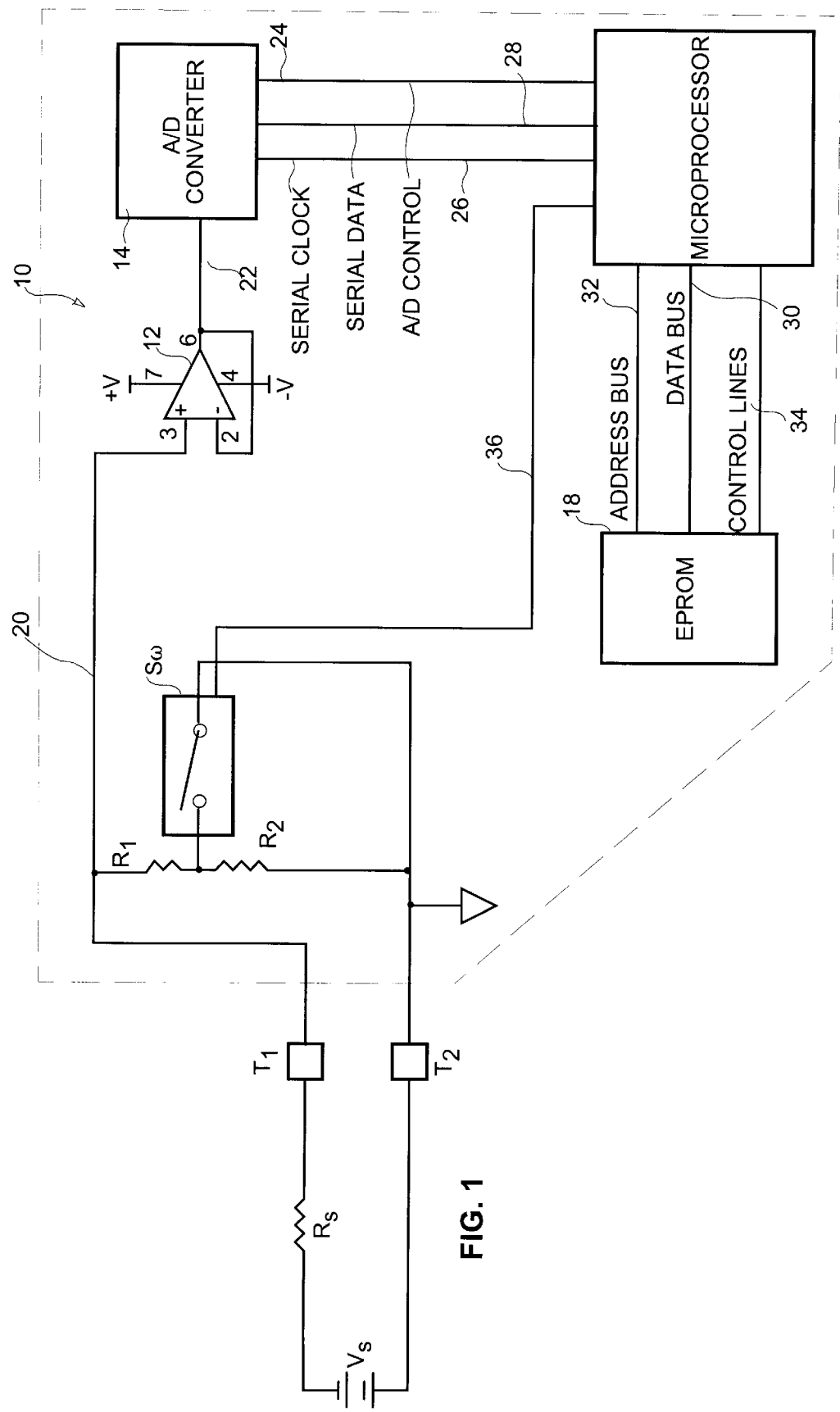
FIG. 1 is a circuit diagram showing components of a first embodiment of the inventive volt meter.

Referring to FIG. 1, a preferred volt meter 10 according to the present invention can be observed. For the purposes of this analytical development, only a small portion of FIG. 1 will be explained. Other portions of FIG. 1 are explained in more detail below.

In FIG. 1, a non-time varying (i.e. DC) voltage source $V_S$ having a characteristic source resistance $R_6$ and two terminals $T_1$ and $T_2$ is provided where the second terminal $T_2$ is grounded. For the purposes of analyzing how the present invention operates, the volt meter 10 includes first and second resistors $R_1$ and $R_2$ which are arranged in series between the first and second terminals $T_1$ and $T_2$. In addition, the meter 10 includes a switch SW which is connected in parallel with the second resistor $R_2$ which can assume open and closed states. When the switch SW is open, both the first and second resistors $R_1$ and $R_2$ are provided between the terminals $T_1$ and $T_2$. However, when the switch SW is closed, a short circuit appear across the second resistor $R_2$ so that only the first resistor $R_1$ is provided between the first and second terminals $T_1$ and $T_2$.

The combination of the first $R_1$ and second $R_2$ resistors provides a total resistance which is some multiple K of the first resistor's value $R_1$. Therefore, $R_1+R_2=KR_1$.

When the switch SW is closed, so that only resistor $R_1$ is provided between the motor terminals $T_1$ and $T_2$, a first voltage referred to herein as $V_1$ is provided at the first terminal $T_1$. The first voltage $V_1$ at terminal $T_1$ can be determined by simple voltage division according to Equation 1:

$$V_1 = \frac{V_s \cdot R_1}{R_1 + R_s} \qquad \text{Eq. 1}$$

Similarly, when the switch SW is open so that a total resistor of $KR_1$ is provided between the first and second terminals $T_1$ and $T_2$, a second voltage $V_2$ is provided at the first terminal $T_1$ which can be determined according to Equation 2:

$$V_2 = \frac{V_s \cdot K \cdot R_1}{KR_1 + R_s} \qquad \text{Eq. 2}$$

Equations 1 and 2 can be combined by forming a ratio according to Equation 3:

$$\frac{V_2}{V_1} = \frac{\dfrac{V_s \cdot K \cdot R_1}{KR_1 + R_s}}{\dfrac{V_s \cdot R_1}{R_1 + R_s}} \qquad \text{Eq. 3}$$

Equation 3 can be solved for the source resistance $R_6$ such that:

$$R_s = \frac{(V_s \cdot K \cdot R_1 - K \cdot V_1 \cdot R_1)}{(V_2 - KV_1)} \qquad \text{Eq. 4}$$

Equations 1 and 2 above can be solved for the input source voltage $V_S$ such that:

$$V_s = \frac{V_1}{R_1}(R_1 + R_s) \qquad \text{Eq. 5}$$

and;

$$V_s = \frac{V_2}{KR_1}(KR_1 + R_s) \qquad \text{Eq. 6}$$

It is assumed that the input source voltage is constant. Therefore, the input source voltages $V_S$ from Equations 5 and 6 can be averaged such that:

$$V_s = \frac{\dfrac{V_1}{R_1} \cdot (R_1 + R_s) + \dfrac{V_2}{KR_1} \cdot (KR_1 + R_s)}{2} \qquad \text{Eq. 7}$$

Combining Equations 4 and 7 and simplifying gives the following compensation equation:

$$V_s = \frac{(K-1)V_1 V_2}{KV_1 - V_2} \qquad \text{Eq. 8}$$

Where the input source voltage is not time varying, Equation 8 can be used to accurately determine the input source voltage.

Where the input source voltage is time varying, the task of accurately determining the input source voltage is more complex because the second voltage reading is a function of the change of input resistance and voltage. Where the input source voltage is time varying, instead of averaging only two sample voltage values to calculate the source voltage, the inventive volt meter samples an odd number of 3 or more (i.e. 3, 5, 7, 9 . . . ) samples, samples sampled alternately at one of the two possible input impedance's (i.e. R or KR). The compensation equation (Eq. 8) is applied to adjacent samples so as to provide one less compensated voltage than there are samples as shown in the following table:

| Input Impedance | Voltage Sampled | Compensation Voltage Calculated from Eq. 8 |
|---|---|---|
| R | $V_1$ | $V_{S1} = f(V_1, V_2)$ |
| KR | $V_2$ | $V_{S2} = f(V_2, V_3)$ |
| R | $V_3$ | $V_{S3} = f(V_3, V_4)$ |
| KR | $V_4$ | $V_{S4} = f(V_4, V_5)$ |
| R | $V_5$ | $V_{S5} = f(V_5, V_{(n-1)})$ |
| KR | $V_{(n-1)}$ | $V_{S(n-1)} = f(V_{(n-1)}, V_{(n)})$ |
| R | $V_{(n)}$ | |

As the table shows, odd voltage samples are sampled with the input impedance set at R, and even voltage samples are sampled with the input impedance set to KR. In an alternate embodiment, this can be reversed, odd voltage samples sampled with the input impedance set at KR and even voltage samples sampled with the input impedance set to R.

The inventive volt meter assumes that the sampling rate is sufficiently fast that the rate of change of the input voltage (dv/dt) is approximately constant during the sampling interval. When this assumption is true, averaging the compensated voltages reduced the effect of the changing input voltage so it has a negligible effect on the compensated voltage. For example, when three voltages are sampled, the first two sample voltages Vs1 and Vs2 are averaged. When five voltages are sampled, the first four sample voltages Vs1, Vs2, Vs3 and Vs4 are averaged. In general the following compensation equation is used for an arbitrary number of odd samples:

$$V_s = \frac{\sum_{i=1}^{n-1} V_{s_1}}{n-1} \qquad \text{Eq. 9}$$

Substituting Equation 8 for $Vs_i$ in Equation 9 gives the following equation:

$$V_s = \frac{\sum_{i=1}^{n-1} \frac{(K-1) \cdot V_i \cdot V_{i+1}}{K \cdot V_i - V_{i+1}}}{n-1} \quad \begin{array}{l} \text{Odd } V_{(n)} \text{ sampled with } R \\ \text{Even } V_{(n)} \text{ sampled with } KR \end{array} \qquad \text{Eq. 10}$$

Where the input source voltage is time varying. Equation 10 can be used to approximate the input voltage at a point in time.

Hardware i. DC Voltage Source

Referring now to FIG. 1, a first preferred embodiment of the inventive volt meter 10 can be used to determine the magnitude of the source voltage $V_S$ where the source voltage $V_S$ is not time varying (i.e. is a DC source). In FIG. 1, the source voltage $V_S$ has a characteristic source resistance $R_S$ which is unknown and has source terminals $T_1$ and $T_2$. The meter 10 includes two dividing resistor $R_1$ and $R_2$, a switch SW, an operational amplifier 12, an analog to digital converter 14, a microprocessor 16, an erasable programmable read only memory (EPROM) 18 and various control lines and data busses.

The first and second resistors $R_1$ and $R_2$, are arranged in series between the source terminals $T_1$ and $T_2$. The switch SW is connected in parallel with the second resistor $R_2$ and can assume open and closed states. When the switch SW is closed, only resistor $R_1$ is positioned between terminals $T_1$ and $T_2$. When the switch SW is open, both resistors $R_1$ and $R_2$ are provided between terminals $T_1$ and $T_2$. A lead line 20 is connected to the first terminal $T_1$ and provides a sample voltage indicative of the fvoltage at terminal $T_1$ to the positive input of the operational amplifier 12. The output of the operational amplifier 12 is connected to its negative input so that the operational amplifier 12 is arranged as a simple voltage follower as well known in the art. Therefore, the sample voltage is provided on the output line 22 of the operational amplifier.

The sample voltage on line 22 is provided to the A-D converter 14 which converts the analog sample voltage signal to a digital signal. The microprocessor 16 controls the EPROM 18, the A-D converter 14 and the switch SW via a plurality of control lines, data lines, and clock lines. The microprocessor 16 is linked to the A-D converter 14 via a serial clock line 26 and an A-D control line 24 which are used to control the A-D converter 14. Digital data from the A-D converter 14 is provided via serial data line 28 to the microprocessor 16 for determining the input source voltage $V_S$.

The microprocessor 16 controls the EPROM 18 via signals on control line 34. The microprocessor 16 is also linked to the EPROM 18 by an address bus 32 and a data bus 30 for transferring information back and forth between the microprocessor 16 and the EPROM 18.

The microprocessor 16 operates in accordance with a program stored in the EPROM 18 to sample digital data from the A-D converter 14 when required and to, between samples of the digital data, change the state of the switch SW from the open state to the closed state, or visa versa.

Figure 2:
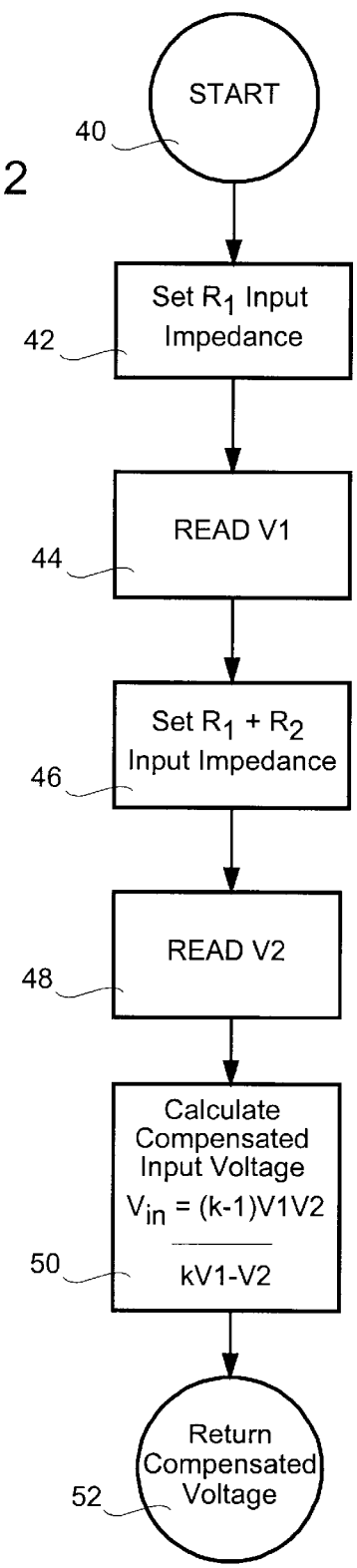
FIG. 2 is a flow chart showing operation of the circuit of FIG. 1.

Referring now to FIGS. 1 and 2, where the input voltage source $V_S$ is not time varying, under the direction of the program stored in the EPROM 18, the microprocessor 16 begins a subroutine to determine an accurate voltage source $V_S$ value at start block 40. At process block 42, the microprocessor 16 closes the switch SW so that only resistor $R_1$ is positioned between the first and second terminals $T_1$ and $T_2$. With resistor $R_1$ between the first and second terminals $T_1$ and $T_2$, a first sample voltage is provided via lead 20, operational amplifier 12 and the A-D converter 14 as a first digital sample voltage signal on serial data line 28. At process block 44 the microprocessor 16 reads the first sample voltage $V_1$ on line 28 and stores the first sample voltage $V_1$. Next, the microprocessor 16 opens the switch SW so that both the first and second resistors $R_1$ and $R_2$ are provided in series between the first and second terminals $T_1$ and $T_2$ at process block 46. Then, at process block 48, the microprocessor 16 reads a second digital sample voltage $V_2$ from serial data line 28.

Once the first and second sample voltage values $V_1$ and $V_2$ have been determined, at process block 50 the microprocessor 16 determines the input voltage according to Equation 8 above. Thereafter, at block 52 the microprocessor 16 returns an extremely accurate compensated input voltage as desired.

ii. Time Varying Voltage Source

Figure 3:
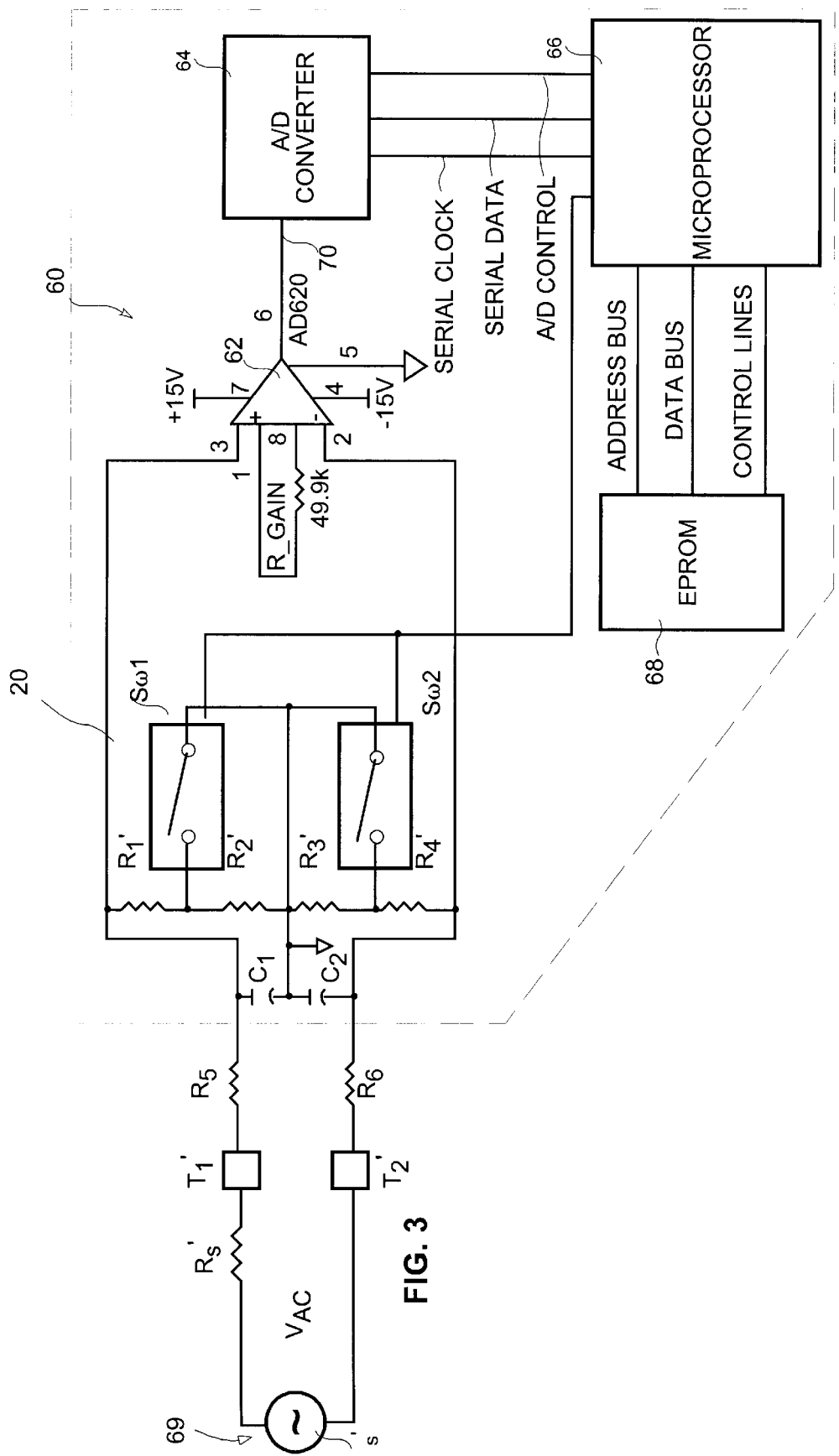
FIG. 3 is a circuit diagram of a second embodiment of the inventive volt meter.

Referring now to FIG. 3, a second embodiment of the inventive volt meter 60 is to be used when the source voltage to be measured is time varying. The second voltage source 69 includes an unknown source resistance $R_S'$ a voltage source $V_S'$ having DC $V_{DC}$ and AC $V_{AC}$ components and two terminals $T_1'$ and $T_2'$. The source components $V_{DC}$ and $V_{AC}$ together provide time varying voltages at the terminals $T_1'$ and $T_2'$. The meter 60, includes first, second, third and fourth dividing resistors $R_1'$, $R_2'$, $R_3'$ and $R_4'$, an instrumentation amplifier 62, an A-D converter 64, a microprocessor 66 and an EPROM 68. In addition to these components, the second embodiment preferably includes two input resistors $R_5$ and $R_6$, and two input capacitors $C_1$ and $C_2$.

The first input resistor $R_5$ is connected to the first terminal $T_1$ at one end and to the first input capacitor $C_1$ at the other. The first input capacitor $C_1$ is also connected to the second input capacitor C2 at an end opposite resistor $R_5$. The second input resistor $R_6$ is connected at one end to the second terminal $T_2'$ and at the other end to the second capacitor $C_2$ opposite the first capacitor $C_1$. Therefore, the first and second input resistors $R_5$ and $R_6$ and the first and second capacitors $C_1$ and $C_2$ are arranged in series between the first and second terminals $T_1'$ and $T_2'$. The first and second dividing resistors $R_1'$ and $R_2'$ are arranged in a series pair and the series pair is in parallel with the first capacitor $C_1$. Similarly, the third and fourth dividing resistors $R_3'$ and $R_4'$ are arranged in a series pair and that series pair is in parallel with the second capacitor $C_2$. The node between the first and second capacitor $C_1$ and $C_2$ is grounded.

The first switch $SW_1$ is connected in parallel with the second dividing resistor $R_2'$ and the second switch $SW_2$ is connected in parallel with the third dividing resistor $R_3'$.

The instrumentation amplifier 62 is connected with a positive input connected to the node between the first capacitor $C_1$ and the first input resistor $R_5$ and the negative input connected to the node between the second capacitor $C_2$ and the second input resistor $R_6$.

The input resistors $R_5$ and $R_6$ have identical characteristics and the input capacitors $C_1$ and $C_2$ have identical characteristics so that the instrumentation amplifier 62 will provide a sample voltage signal on its output line 70 indicative of the voltage difference between the first and second terminals $T_1'$ and $T_2'$.

Figure 4:
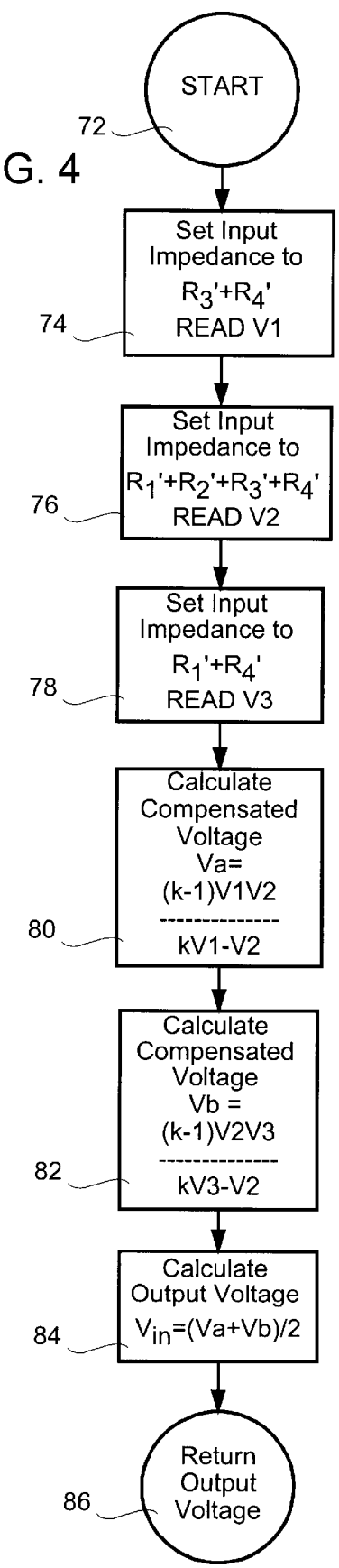
FIG. 4 is a flow chart showing operation of the circuit in FIG. 3.

Identical components in both the first (FIG. 1) and second (FIG. 3) embodiments operate in a similar manner with a few notable exceptions. One exception is that instead of using Equation 8 to determine the input voltage $V_S$, the microprocessor 66 in FIG. 3 uses Equation 10 above where $R=R_1'+R_4'$ and $KR=R_1'+R_2'+R_3'+R_4'$. In addition, when the microprocessor 66 opens and closed the first switch $SW_1$, the microprocessor 66 also opens and closed the second switch $SW_2$ in a similar manner. All of the other components of the second embodiment 60 of the meter operate in the fashion similar to that described above with respect to the first embodiment Referring now to FIGS. 3 and 4, when a varying input source voltage $V_S'$ is to be measured, the microprocessor 66 begins at start block 72 and, at process block 74 closes the first and second switches $SW_1$ and $SW_2$ so that resistor $R_1'$ is in parallel with the first capacitor $C_1$ and resistor $R_4'$ is in parallel with the second capacitor $C_2$. Then, also at block 74 the microprocessor 66 reads the first sample voltage $V_1$ and stores the first sample voltage. Next, at process block 76, the microprocessor 66 opens the first and second switches $SW_1$ and $SW_2$ so that resistors $R_1'$ and $R_2'$ are all in parallel with the first capacitor $C_1$ and resistors $R_3'$ and $R_4'$ are in parallel with the second capacitor $C_2$. At this point, the microprocessor 66 reads and stores the second sample voltage $V_2$.

Next, at process block 78 the microprocessor 66' again closes the first and second switches $SW_1$ and $SW_2$ so that the first and fourth resistors $R_1'$ and $R_4'$ are in parallel with the first and second capacitors $C_1$ and $C_2$, respectively. At this point, the microprocessor 66 reads the third sample voltage $V_3$.

After at least three sample voltages have been read by the microprocessor 66, at process block 80 the microprocessor determines a voltage value $V_a$ using the ratio K and the first and second sample voltage values $V_1$ and $V_2$ according to Equation 8. Similarly, at process block 82, the microprocessor 66 uses the ratio K and the second and third sample voltage values $V_2$ and $V_3$ to determine a voltage value $V_b$ according to Equation 8 where the second voltage value $V_2$ is $V_1$ and the third voltage value $V_3$ is $V_2$. Next, at process block 84, the microprocessor 66 calculates the output voltage by averaging the voltage values $V_a$ and $V_b$ and at block 86 the microprocessor 66 returns the input source voltage $V_S'$ as desired. In the alternative, the microprocessor 66 could skip blocks 80–86 and use Equation 9 to determine the input source voltage $V_S$. Referring to Equation 9, where only three sample voltages are to be read, n=3 and Equation 9 simplifies to:

$$V_s = \frac{V_{s1} + V_{s2}}{2} \qquad \text{Eq. 11}$$

It should be understood that the methods and apparatus as described above are only exemplary and do not limit the scope of the invention, and that various modifications could be made by those skilled in the art that may fall under the scope of the invention. For example, while two different embodiments are described above, one to be used with a time varying input voltage source and another to be used with a DC voltage source, the present invention also contemplates a single apparatus that is capable of being configured as shown in either FIG. 1 or FIG. 3 above, depending upon whether or not the input voltage source is DC or time varying. In this case, prior to beginning either of the voltage calculating routines shown in FIGS. 2 and 4, the microprocessor would download either a DC measuring subroutine or a time varying subroutine from the EPROM and would reconfigure its hardware when required to provide necessary functionality. In addition, the present invention is meant to include a volt meter wherein more than two known dividing resistance values are used. For example, a third dividing resistance could be employed as an accuracy check by the microprocessor.

Moreover, while the previous discussion pertained to use of the invention to measure voltage sources, using Norton's theorem it is clear that the same method may be used for measuring current sources. Furthermore, while the previous discussion shows a resistive element placed across the input terminals, the resistive element can be generalized to any impedance that meets the requirements of the invention.

Furthermore, it should be understood that, while the description above indicates that the circuit shown in FIG. 1 is used for measuring DC voltage and the circuit of FIG. 3 is used for measuring AC, either circuit could be used to measure either AC or DC voltage. In fact, it might be preferable to use the circuit of FIG. 3 to measure DC voltage as it would result in common mode rejection.

In order to apprise the public of the various embodiments that may fall within the scope of the invention, the following claims are made.

We claim:

1. An apparatus for measuring the magnitude of a voltage source having an unknown source resistance, the apparatus comprising:

a resistive element including two series resistors and a bypass switch in parallel with one of the resistors, the resistive element positionable between the source and a ground, the resistive element alterable between first and second resistances by opening and closing the bypass switch;

a lead linked to the resistive element, a sample voltage across the resistive element provided on the lead; and a controller linked to the lead for sampling sample voltages on the lead and also linked to the resistive element for opening and closing the switch, the controller also for determining the input voltage source magnitude;

wherein, the controller samples a first sample voltage on the lead at the first resistance, changes the resistive element resistance to the second resistance, samples a second sample voltage on the lead across the second resistance and uses the first and second sample voltages to determine the voltage source magnitude.

2. The apparatus of claim 1 wherein the controller determines the source magnitude voltage by mathematically combining the first and second sample voltages and the ratio of second to first resistances.

3. The apparatus of claim 2 wherein the input voltage is DC and the controller determines the voltage source magnitude according to the equation:

$$V_s = \frac{(K-1)V_1 \cdot V_2}{K \cdot V_1 - V_2}$$

where $V_S$ is the voltage source magnitude, K is the ratio of the second resistance to the first resistance, $V_1$ is the first sample voltage and $V_2$ is the second sample voltage.

4. The apparatus of claim 3 wherein K is between 0.5 and 10.0.

5. The apparatus of claim 4 wherein K is approximately 2.0.

6. The apparatus of claim 2 wherein the controller can also determine a source resistance associated with the voltage source by mathematically combining the first and second sample voltages and the ratio of second to first resistances.

7. The apparatus of claim 2 wherein the input voltage is time varying and, after the controller samples the second sample voltage at the second resistance, the controller changes the resistance back to the first resistance and samples a third voltage at the first resistance, and the controller determines the source magnitude voltage by mathematically combining the first, second and third sample voltages and the ratio of second to first resistances.

8. The apparatus of claim 7 wherein the controller determines the input voltage source magnitude by solving the following equation:

$$V_s = \frac{\frac{V_1 \cdot V_2(K-1)}{KV_1 - V_2} + \frac{V_2 V_3(K-1)}{KV_3 - V_2}}{2}$$

where $V_S$ is the input voltage source magnitude, K is the ratio of the second resistance to the first resistance, $V_1$ is the first sample voltage, $V_2$ is the second sample voltage and $V_3$ is the third sample voltage.

9. The apparatus of claim 7 wherein, beginning at time n, the controller samples first, second and third sample voltages $\zeta$ times, one sample each $t_S$ seconds, each sample being a measured voltage, and the controller uses all of the measured voltages to determine the input voltage according to the Equation:

$$V_s = \frac{V_{s1} + V_{s2}}{2}$$

where $V_{in}$ is the input voltage and $V_m$ is a measured voltage at the time specified in brackets thereafter.

10. The apparatus of claim 1 wherein the values of the two parallel resistors are substantially equal.

11. The apparatus of claim 10 wherein each of the two parallel resistors is approximately 500 Kohlms.

12. The apparatus of claim 1 wherein the controller includes a microprocessor.

* * * * *